(12) United States Patent
Straeussnigg et al.

(10) Patent No.: US 12,368,448 B2
(45) Date of Patent: Jul. 22, 2025

(54) EFFICIENT FILTERING ARCHITECTURE WITH REDUCED GROUP DELAY FOR DECOMPRESSION USING PREDICTOR

(71) Applicant: Infineon Technologies AG, Neubiberg (DE)

(72) Inventors: Dietmar Straeussnigg, Villach (AT); Simon Grünberger, Moosburg (AT)

(73) Assignee: Infineon Technologies AG, Neubiberg (DE)

( * ) Notice: Subject to any disclaimer, the term of this patent is extended or adjusted under 35 U.S.C. 154(b) by 173 days.

(21) Appl. No.: 18/189,610

(22) Filed: Mar. 24, 2023

(65) Prior Publication Data

US 2024/0322833 A1    Sep. 26, 2024

(51) Int. Cl.
    *H04R 3/04* (2006.01)
    *H03M 1/06* (2006.01)
    *H03M 7/40* (2006.01)
    *H04R 19/04* (2006.01)

(52) U.S. Cl.
    CPC ........... *H03M 1/0626* (2013.01); *H03M 7/40* (2013.01); *H04R 3/04* (2013.01); *H04R 19/04* (2013.01); *H04R 2201/003* (2013.01); *H04R 2430/01* (2013.01)

(58) Field of Classification Search
    CPC ........ H03M 1/0626; H03M 7/40; H04R 3/04; H04R 19/04; H04R 2201/003; H04R 2430/01
    USPC .................................................... 381/98, 122
    See application file for complete search history.

(56) References Cited

U.S. PATENT DOCUMENTS

| | | | |
|---|---|---|---|
| 9,380,381 B2* | 6/2016 | Straussnigg | H04M 1/12 |
| 2015/0131819 A1* | 5/2015 | Straeussnigg | H04R 1/04 |
| | | | 381/173 |
| 2015/0256914 A1* | 9/2015 | Wiesbauer | H04R 19/005 |
| | | | 381/174 |
| 2016/0087596 A1* | 3/2016 | Yurrtas | H04R 1/04 |
| | | | 381/111 |
| 2019/0123753 A1 | 4/2019 | Straeussnigg | |
| 2020/0389726 A1 | 12/2020 | Melanson | |
| 2022/0399865 A1 | 12/2022 | Valle et al. | |

OTHER PUBLICATIONS

Jose Luis Ceballos et al., "Logarithmic Amplifiers in Silicon Microphones" U.S. Appl. No. 17/660,120, filed Apr. 21, 2022.

* cited by examiner

*Primary Examiner* — William A Jerez Lora
(74) *Attorney, Agent, or Firm* — Slater Matsil, LLP

(57) ABSTRACT

A digital microphone includes a log amplifier having an input for receiving an analog signal; an analog-to-digital converter (ADC) coupled to the log amplifier; a digital low-pass filter coupled to the ADC; a digital decompression component coupled to the digital low-pass filter; and a predictor filter coupled to the digital decompression component, the predictor filter having an output for generating a digital signal. The digital low-pass filter is a positive group delay filter and the predictor filter is a negative group delay filter. The digital microphone has an improved Signal-to-Noise Ratio (SNR) due to filtering, but without increasing overall group delay.

20 Claims, 7 Drawing Sheets

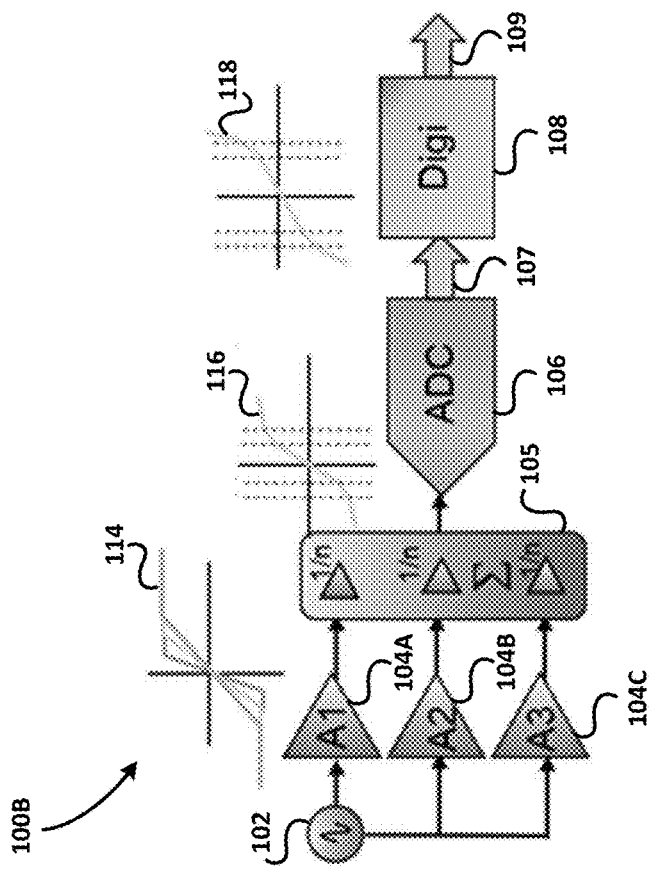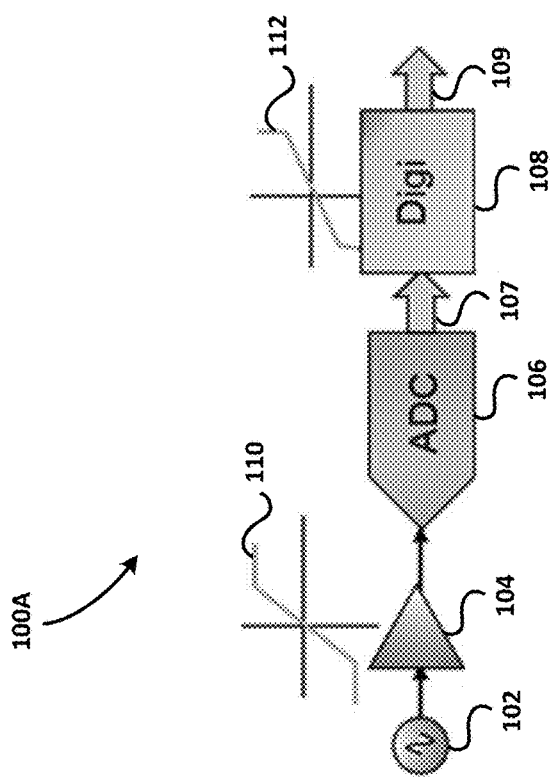
FIG. 1B
FIG. 1A

EFFICIENT FILTERING ARCHITECTURE WITH REDUCED GROUP DELAY FOR DECOMPRESSION USING PREDICTOR

TECHNICAL FIELD

The present invention relates generally to an efficient filtering architecture with reduced group delay for decompression using a predictor and, in particular embodiments, a corresponding method.

BACKGROUND

Digital microphones (also known as "silicon microphones") are known in the art. Many modern digital microphones exhibit good signal-to-noise ratios (SNR) with relatively low power consumption. Digital microphones typically include a microelectromechanical systems (MEMS) device coupled to an application-specific integrated circuit (ASIC). The MEMS device is typically a capacitive MEMS device having a flexible silicon membrane that is sensitive to ambient sounds waves for generating an analog signal. The ASIC typically includes an analog-to-digital converter (ADC) for converting the analog input signal into an output digital signal. The ASIC also can include other analog and digital components such as filters, amplifiers, modulators, switches, clocking and control components, as well as other such components.

While prior art digital microphones already provide good performance, new customer requirements dictate the ongoing need for new digital microphone products having increased SNR and reduced power consumption. Solutions for increasing SNR and reducing power consumption are known, but some of these solutions include additional filtering. The additional filtering can cause additional problems in some applications.

SUMMARY

According to an embodiment, a digital microphone comprises a log amplifier having an input for receiving an analog signal; an analog-to-digital converter (ADC) coupled to the log amplifier; a positive group delay filter coupled to the ADC; a digital decompression component coupled to the positive group delay filter; and a negative group delay filter coupled to the digital decompression component, the negative group delay filter having an output for generating a digital signal.

According to an embodiment, a microphone comprises a first analog-to-digital converter (ADC) having an input for receiving an analog signal; a second ADC having an input for receiving the analog signal; a first positive group delay filter coupled to the first ADC; a second positive group delay filter coupled to the second ADC; a combination circuit coupled to the first positive group delay filter and to the second positive group delay filter; a controller coupled between inputs of the first ADC and the second ADC, and a control input of the combination circuit; and a negative group delay filter coupled to the combination circuit for generating a digital signal.

According to an embodiment, a circuit comprises a first analog-to-digital converter (ADC); a first positive group delay filter coupled to the first ADC; a digital processing circuit coupled to the first positive group delay filter; and a negative group delay filter coupled to the digital processing circuit.

BRIEF DESCRIPTION OF THE DRAWINGS

For a more complete understanding of the present invention, and the advantages thereof, reference is now made to the following descriptions taken in conjunction with the accompanying drawings, in which:

FIG. 1A is a block diagram of an exemplary logarithmic amplifier system;

FIG. 1B is a block diagram of another exemplary logarithmic amplifier system;

DETAILED DESCRIPTION OF ILLUSTRATIVE EMBODIMENTS

Figure 2A:
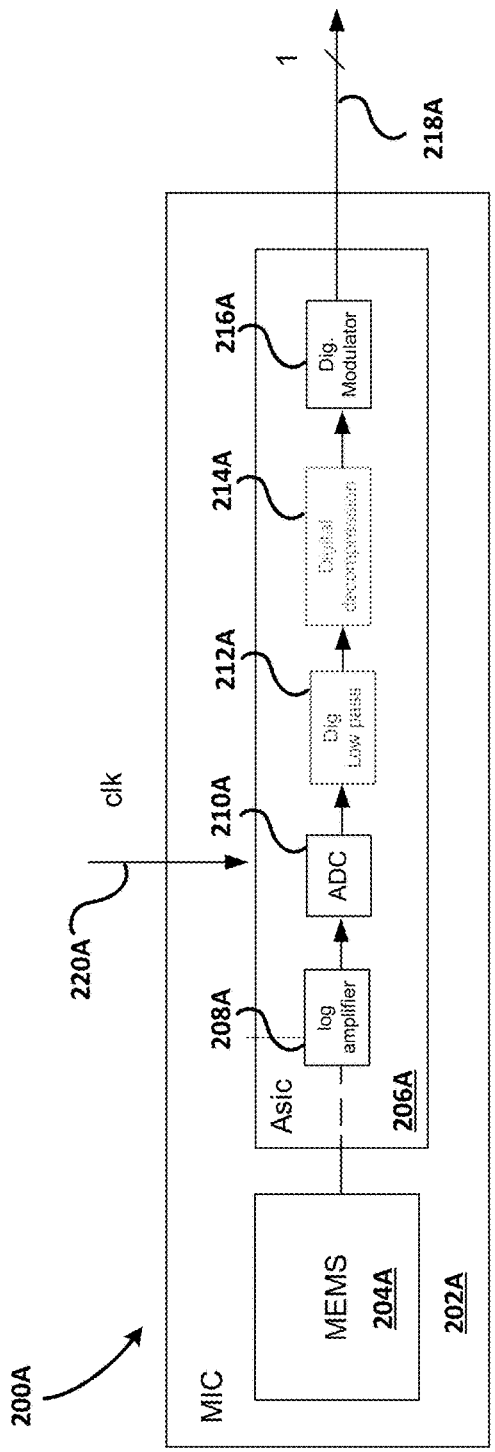
FIG. 2A is a block diagram of a digital microphone including an ASIC having exemplary compression and decompression components.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same or similar elements have been designated by corresponding references in the different drawings if not stated otherwise.

According to embodiments, an architecture for a digital microphone is described in detail below that combines a low-pass filter, a predictor filter, and other signal processing components to achieve efficient decompression with reduced overall group delay. The embodiment architecture achieves an improved SNR due to filtering but without increasing overall group delay or power consumption.

The requirements for increasing SNR and reducing power consumption in digital microphones demanded by customers continue. These specifications have led to the introduction of innovative architectures such as the logarithmic amplifier approach described in co-pending U.S. patent application Ser. No. 17/660,120, entitled "Logarithmic Amplifiers in Silicon Microphones," which is hereby incorporated by reference. FIGS. 1A and 1B are block diagrams of a logarithmic amplifier architecture, which is described in detail below.

In an analog domain of the logarithmic amplifier architecture the input signal is compressed, starting at a predetermined input signal level, and in a digital domain of the logarithmic amplifier architecture the compressed signal is decompressed to retrieve the original linear signal. In general, the logarithmic amplifier architecture shown in FIGS. 1A and 1B leads to the necessity of stronger digital low-pass filtering to allow full performance for the decompression operation. Stronger low-pass filtering, however, introduces significant group delay, which is in contradiction to the low group delay specification (mainly driven by acoustic noise cancellation (ANC) applications) of most digital microphone products.

FIG. 1A is a block diagram of an exemplary logarithmic amplifier system 100A comprising an analog programmable gain amplifier 104 for receiving an analog input signal 102 (which may be generated by a MEMS device, not shown in FIG. 1A), an analog-to-digital converter (ADC) 106, and a digital anti-logarithmic component 108. ADC 106 is coupled to the digital anti-logarithmic component 108 through digital bus 107. The digital anti-logarithmic component 108 comprises an output bus 109 that provides a linearized digital signal. The analog programmable gain amplifier 104 has a logarithmic transfer function 110 (due to the saturation of the amplifier), and the digital anti-logarithmic component 108 has an anti-logarithmic transfer function 112.

FIG. 1B is a logarithmic amplifier system 100B comprising a "quantized" analog logarithmic programmable gain amplifier (PGA) comprising individual amplifiers 104A, 104B, and 104C, each receiving an analog input signal 102 (which may be generated by a MEMS device, not shown in FIG. 1B). Each individual amplifier 104A, 104B, and 104C has a linear gain until it saturates for a given (increasing) maximum amplitude input signal. While three individual amplifiers are shown in FIG. 1B, any number greater than or equal to two can be used. The individual amplifiers gains are shown as a composite transfer function 114 showing the saturation occurring at different input voltage values. Each amplifier input is coupled to a corresponding input of a summing circuit 105. The summing circuit 105 provides a more accurate piece-wise linear logarithmic transfer function 116, wherein the accuracy of the logarithmic transfer function is determined by the number of individual amplifiers 104A, 104B, and 104C used. Analog-to-digital converter (ADC) 106 has an input coupled to the output of the summing circuit 105 to generate a digital representation of the logarithmically compressed analog signal on digital bus 107. The digital anti-logarithmic component 108 comprises an output bus 109 that provides a linearized digital signal by applying an anti-logarithmic transfer function 118 to the digital logarithmic signal received on digital bus 107. In FIG. 1B, it can be seen the signal compression is performed in the analog domain using the "quantized" approach described above, and the signal decompression is performed in the digital domain.

In existing solutions, a tradeoff is therefore made between decompression performance (SNR/leveled noise, total harmonic distortion (THD)) and group delay is made. For example, applying a stronger low-pass filter (having a lower cut-off frequency) leads to better SNR but bigger group delay.

FIG. 2A is a block diagram of a digital microphone 200A including a MEMS device 204A coupled to an ASIC 206A inside one or more packages 202A. The ASIC 206A includes exemplary compression and decompression components. The analog signal generated by the MEMS device 204A is received and compressed by logarithmic amplifier 208A. The compressed signal is converted into a digital signal by ADC 210A. For improved decompression performance, the digital signal is filtered by digital low-pass filter 212A. In an embodiment, a band-pass filter with a low cut-off frequency can also be used. In other embodiments, any other type of filter resulting in a positive group delay can also be used. The filtered and compressed digital signal is decompressed using a digital decompression component 214A. In some embodiments the decompressed digital signal is converted into a one bit digital signal using a one-bit digital modulator 216A to output a one-bit digital signal on output bus 218A. Digital microphone 200A also includes an input 220A for receiving a clock signal (clk) that is distributed to one or more components in ASIC 206A. For digital microphone 200A, there is a tradeoff between the level of filtering used in the digital low-pass filter 212A for SNR performance, and the additional group delay that can be tolerated given the specification requirements demanded by the customer.

Figure 2B:
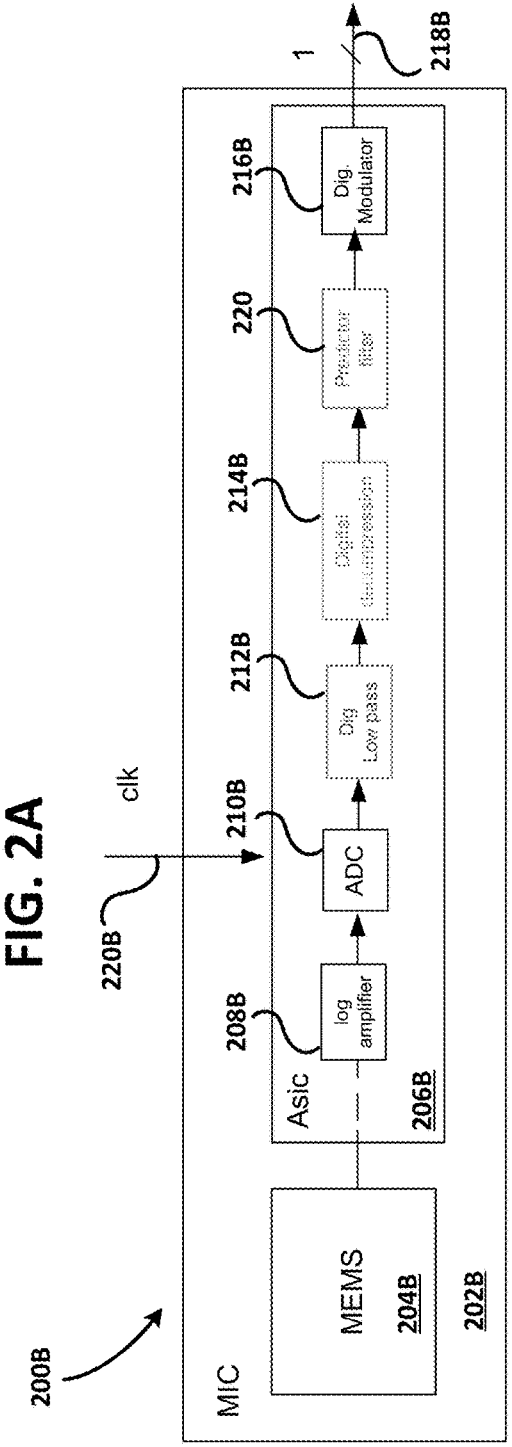
FIG. 2B is a block diagram of a digital microphone having an architecture for efficient decompression with reduced group delay, according to an embodiment.

In FIG. 2B an architecture of a digital microphone is shown using the low-pass filter but with improved group delay. The architecture of FIG. 2B achieves both an advantageously low group delay specification while maintaining good decompression performance. The architecture of FIG. 2B combines a low-pass filter before the digital decompression components and a predictor filter (with negative group delay) after the digital decompression components. The decompression performance (SNR/leveled noise, THD) is determined with the low-pass filter and the group delay is improved with the predictor filter. This configuration allows either for a given group delay target to apply stronger low-pass filtering (leading to a better decompression performance) or to be reduced for a given low-pass filter setting. While a "predictor filter" is described herein, any other type of digital filter that results in a negative group delay can also be used in other embodiments.

FIG. 2B is a block diagram of a digital microphone 200B having an architecture for efficient decompression with reduced group delay. Digital microphone 200B includes a MEMS device 204B coupled to an ASIC 206B inside one or more packages 202B. The ASIC 206B includes exemplary compression and decompression components, as well as a predictor filter 220 described below. The analog signal generated by the MEMS device 204B is received and compressed by logarithmic amplifier 208B. The compressed signal is converted into a digital signal by ADC 210B. For improved decompression performance, the digital signal is filtered by digital low-pass filter 212B. The filtered and compressed digital signal is decompressed using a digital decompression component 214B.

After compression, decompressed digital signal is further filtered by predictor filter 220 to add a negative group delay. Various predictor filter implementations are shown and described below.

In some embodiments the decompressed and filtered digital signal is converted into a one bit digital signal using a one-bit digital modulator 216BA to output a one-bit digital signal on output bus 218B. Digital microphone 200B also includes an input 220B for receiving a clock signal (clk) that is distributed to one or more components in ASIC 206B. For digital microphone 200B, the negative group delay provided by predictor filter 220 allows for greater SNR for a given overall group delay, or the same SNR with an improved overall group delay.

The architecture of FIG. 2B advantageously allows efficient decompression with reduced group delay, configurability with respect to decompression performance (low-pass versus predictor filter), reduced group delay (predictor filter with negative group delay), no overload of the noise shaper (one-bit digital modulator), and an effective placement of the predictor-filter in the digital signal processing path.

Figure 3A:
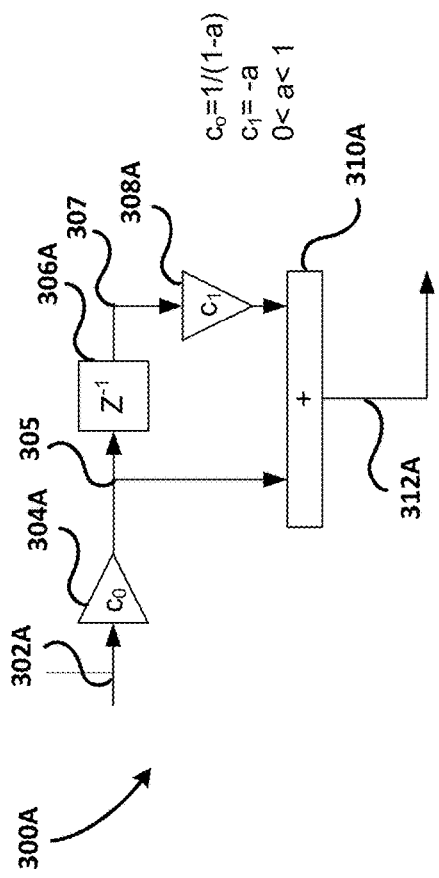
FIG. 3A is a schematic diagram of a first order predictor filter with negative group delay for use in the digital microphone of FIG. 2B, according to an embodiment.
Figure 3B:
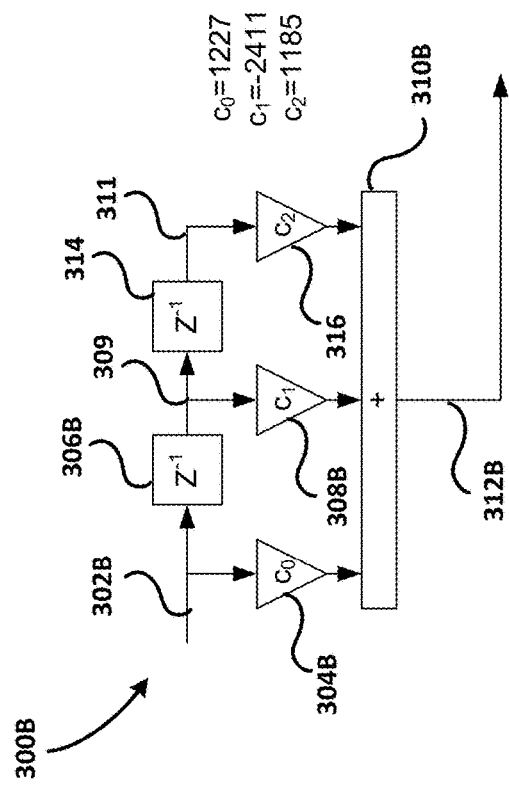
FIG. 3B is a schematic diagram of a second order predictor filter with negative group delay for use in the digital microphone of FIG. 2B, according to an embodiment.
Figure 4A:
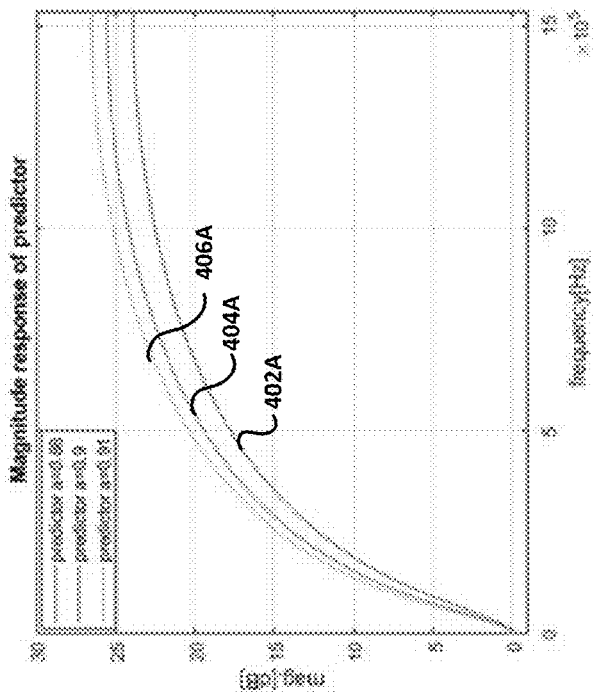
FIG. 4A is a plot of a magnitude response of the first order predictor filter, according to an embodiment.
Figure 4B:
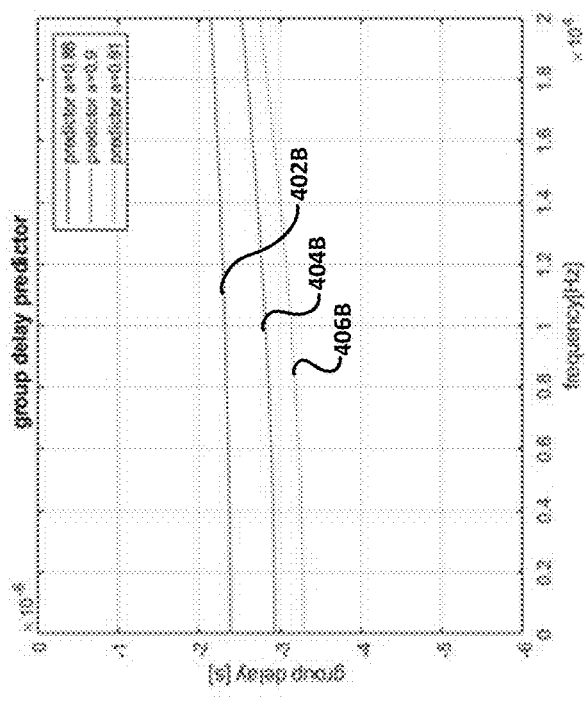
FIG. 4B is a plot of the group delay of the first order predictor, according to an embodiment.

FIGS. 3A and 3B illustrate examples of a predictor filter, wherein FIG. 4A is a schematic diagram of a first order predictor filter with negative group delay, and wherein FIG. 4B is a schematic diagram of a second order predictor filter with negative group delay.

FIG. 3A is a schematic diagram of a first order predictor filter 300A including a first digital multiplier (digital gain component) 304A coupled between input node 302A and internal node 305. First digital multiplier 304A has a multiplication value $c_0=1/(1-a)$, wherein "a" is a number between zero and one. An inverse Z-transform component 306A is coupled between internal nodes 305 and 307, and a second digital multiplier 308A coupled to internal node 307. Multiplier 308A has a multiplication value $c1=-a$. First order predictor filter 300A also includes a summer having a first input coupled to the output of first digital multiplier 304A, a second input coupled to the output of second digital multiplier 308A, and an output 312A for providing a filtered output having a negative group delay.

FIG. 3B is a schematic diagram of a second order predictor filter 300B including a first digital multiplier 304A coupled to input node 302B, a second digital multiplier 308B coupled to internal node 309, and a third digital multiplier 316 coupled to internal node 311. In an embodiment, first digital multiplier 304B has a multiplication value $c_0=1227$, second digital multiplier 308B has a multiplication value $c1=-2411$, and third digital multiplier 316 has a multiplication value $c2=1185$. A first inverse Z-transform component 306B is coupled between input node 302B and internal node 309, and a second inverse Z-transform component 314 coupled to internal node 311. Second order predictor filter 300B also includes a summer having a first input coupled to the output of first digital multiplier 304B, a second input coupled to the output of second digital multiplier 308B, a third input coupled to the output of third digital multiplier 316, and an output 312B for providing a filtered output having a negative group delay.

In FIG. 4A the boosting property (magnitude response) of a predictor filter such as first order predictor filter 300A is illustrated. Graph 400A plots the magnitude response in decibels (dB) versus frequency (Hz) for three gain settings. Trace 402A shows the magnitude response for a=0.88, trace 404A shows the magnitude response for a=0.9, and trace 406A shows the magnitude response for a=0.91. It should be noted that in the audio band a flat filter response is desired, but above the audio band the magnitude boosting behavior as shown can be allowed, which is sometimes an artifact of a negative group delay filter.

In FIG. 4B the group delay (specifically negative group delay) of a predictor filter such as first order predictor filter 300A is illustrated. Graph 400B plots the group delay in seconds (s) versus frequency (Hz) for three gain settings. Trace 402B shows the group delay for a=0.88, trace 404B shows the group delay for a=0.9, and trace 406B shows the group delay for a=0.91.

Figure 5A:
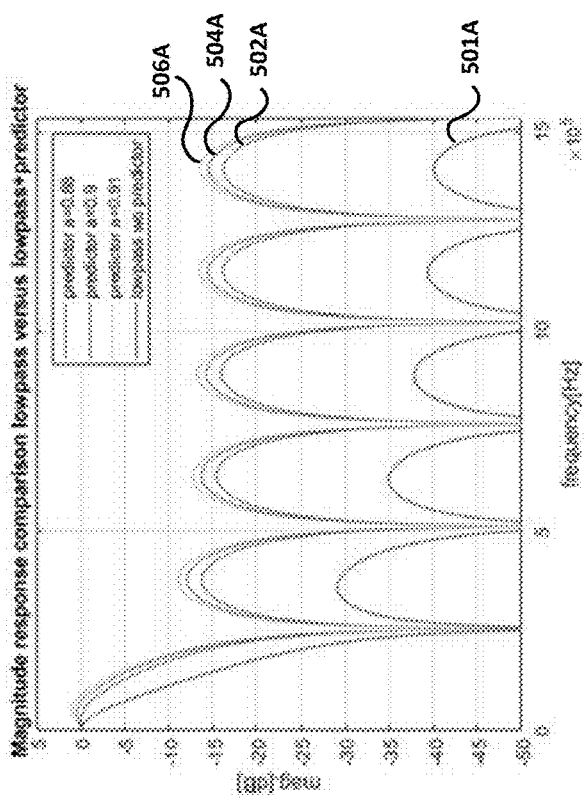
FIG. 5A is a plot of the comparison magnitude response for the low-pass filter digital microphone of FIG. 2A versus the low-pass filter plus predictor filter digital microphone of FIG. 2B.

FIG. 5A is a graph 500A showing a comparison of the magnitude response for a digital microphone architecture including a low-pass filter versus a digital microphone architecture including a low-pass filter and a predictor filter. Graph 500A plots the magnitude response in decibels (dB) versus frequency (Hz) for three gain settings, as well as the magnitude response without the predictor filter. Trace 502A shows the magnitude response for a=0.88, trace 504A shows the magnitude response for a=0.9, trace 506A shows the magnitude response for a=0.91, and trace 501A shows the magnitude response without a predictor filter. The boosting effect of the predictor filter, such as predictor filter 302, can be clearly seen in FIG. 5A.

Figure 5B:
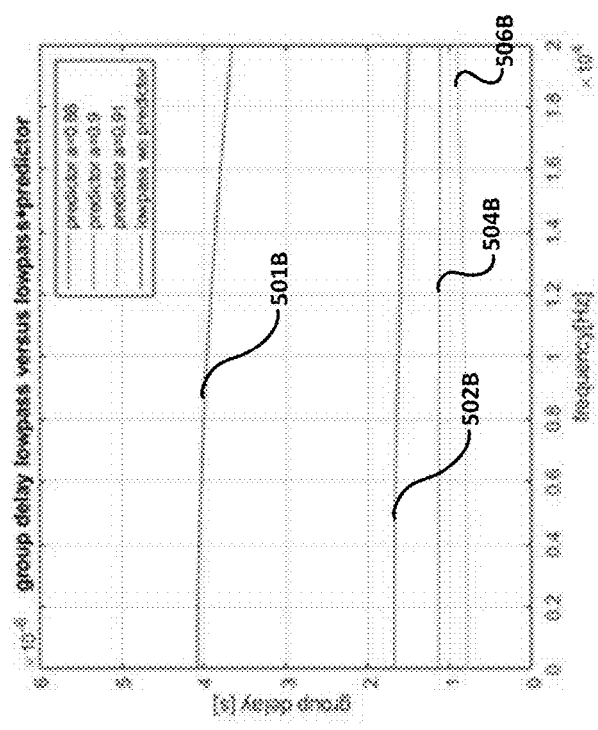
FIG. 5B is a plot of the comparison group delay response for the low-pass filter digital microphone of FIG. 2A versus the low-pass filter plus predictor filter digital microphone of FIG. 2B.

FIG. 5B is a graph 500B showing a comparison of the group delay for a digital microphone architecture including a low-pass filter versus a digital microphone architecture including a low-pass filter and a predictor filter. Graph 500B plots the magnitude response in decibels (dB) versus frequency (Hz) for three gain settings, as well as the magnitude response without the predictor filter. Trace 502B shows the magnitude response for a=0.88, trace 504B shows the magnitude response for a=0.9, trace 506A shows the magnitude response for a=0.91, and trace 501A shows the magnitude response without a predictor filter. The predictor filter has negative group delay for all three gain settings, which can be clearly seen in FIG. 5B, and therefore the overall group delay of the digital microphone is reduced.

Figure 6:
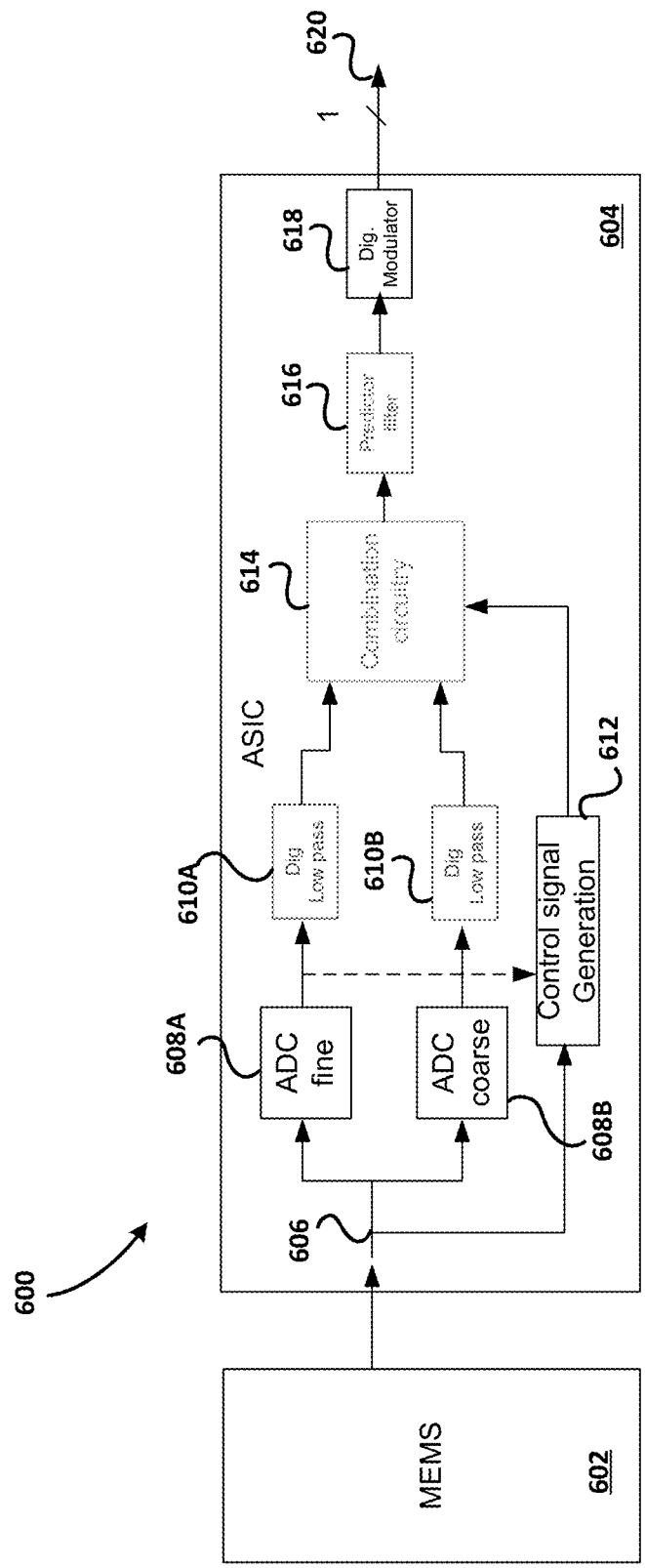
FIG. 6 is a block diagram of a digital microphone having two ADCs and a predictor filter, according to another embodiment.
Figure 7:
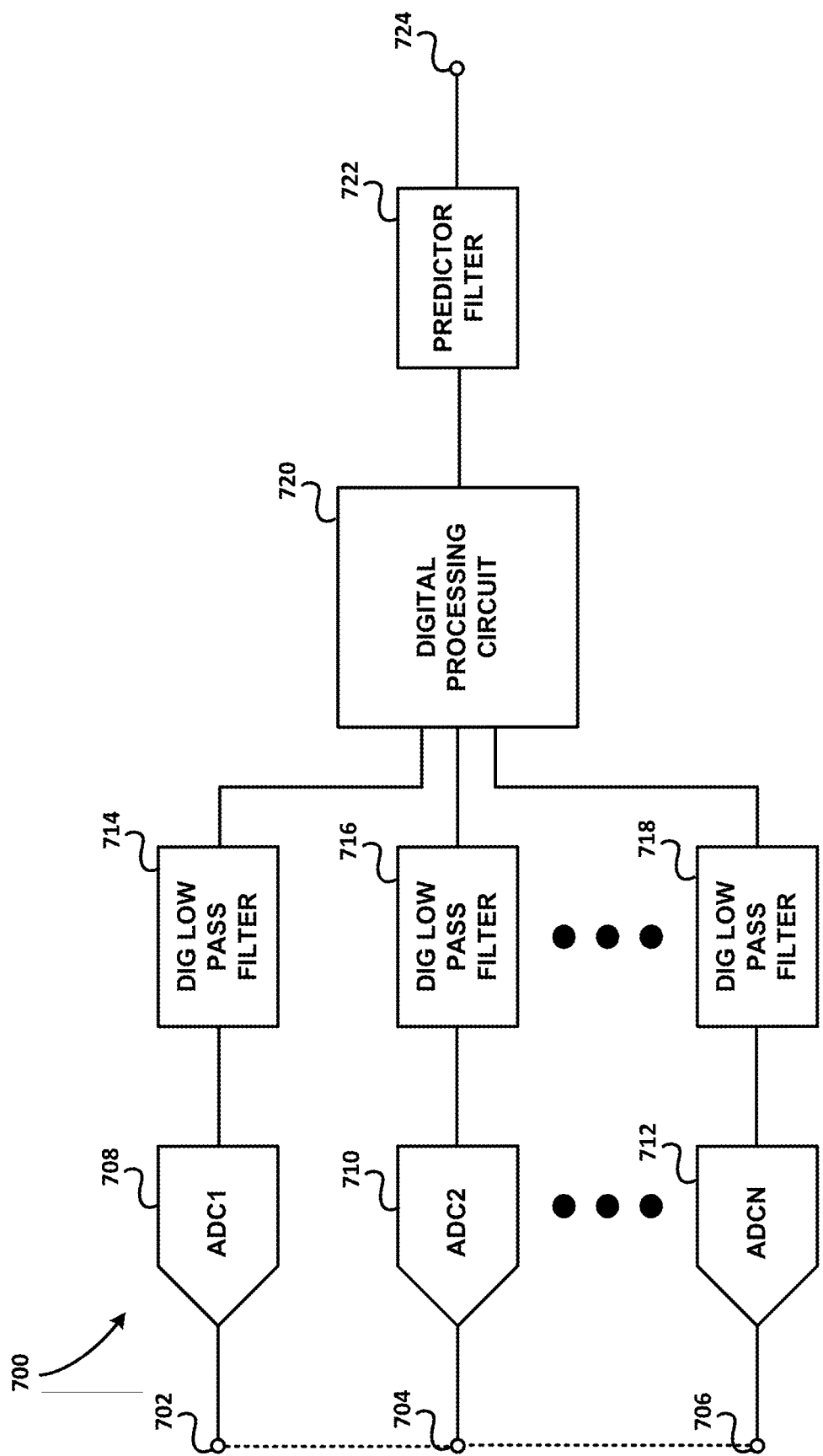
FIG. 7 is a block diagram of a digital microphone having three or more ADCs and a predictor filter, according to an embodiment.

The digital microphone architecture including a predictor filter has been described with respect to a signal processing chain that includes a single ADC, in an embodiment. However, the digital microphone architecture described herein can be also applied to digital microphone architectures including two or more ADCs. Many of these digital microphone architectures include compression and decompression components, as well as low-pass filtering components. Some of these architectures would benefit from the predictor filter to lower overall group delay as disclosed herein. A digital microphone architecture having two ADCs is shown in FIG. 6 and described in further detail below. An architecture for a digital microphone or other products having three or more ADCs is shown in FIG. 7 and described in further detail below.

FIG. 6 is a block diagram of a digital microphone having two ADCs and a predictor filter, according to another embodiment. A related digital microphone architecture without the predictor filter is shown and described in U.S. Pat. No. 9,380,381 entitled "Microphone Package and Method for Providing a Microphone Package," which is hereby incorporated by reference.

FIG. 6 schematically illustrates a digital microphone 600 for providing a microphone signal. Digital microphone 600 comprises a MEMS device 602 for generating an analog signal in response to sound ambient waves, and an ASIC 604 comprises various signal processing components described below. Digital microphone 600 also comprises a first ADC 608A (which can comprise fine resolution) coupled to MEMS device 602 at ASIC input node 606. The first ADC 608A provides a first digital signal. Digital microphone 600 further comprises a second ADC 608B (which can comprise a coarse resolution compared to the fine resolution of the first ADC 608A) coupled to MEMS device 602 at ASIC input node 606. The second ADC 608B provides a second digital signal. The first digital signal is digitally filtered by digital low-pass filter 610A, and the second digital signal is digitally filtered by digital low-pass filter 610B. The digital low-pass filters can comprise any type of positive group delay filter, in embodiments. Furthermore, digital microphone 600 comprises a combination circuit 614 coupled to digital low-pass filter 610A and digital low-pass filter 610B. A predictor filter 616 is coupled to the output of combination circuit 614 to provide gain and a negative group delay as has been previously described. Any type of negative group delay filter can be used, in embodiments. A one-bit digital modulator converts the digital output signal of the predictor filter into a one-bit digital stream at the output node 620 in some embodiments. In some embodiments, a control signal generation circuit 612 is coupled between the ASIC input and a control input of the combination circuit 614. The control signal generation circuit 612 may optionally receive a feedback signal based on the first digital signal from first ADC 608A (fine resolution).

Other variations of the architecture of digital microphone 600 are possible. In summary, however, digital microphone comprises a first ADC 608A, a second ADC 608B, a first digital low-pass filter 610A, a second digital low-pass filter 610B, a combination circuit 614, and a predictor filter 616. The first and second digital low-pass filters are used to improve SNR performance but may add to the overall group delay of the digital microphone 600. The predictor filter 616 has a negative group delay, resulting in a reduced overall group delay for a given SNR, or the same overall group delay for an improved SNR.

Combination circuit 614 may, for example, comprise one or more switches or other circuits to combine a plurality of signals such as an additive combiner, a multiplier, a divider or an amplifier. Moreover, combination circuit 614 may comprise a programmable hardware component such as a gate array or a general purpose processor. Combination circuit 614 may also include other signal processing functions in addition to the combining function. In some embodiments the first ADC 608A and the second ADC 608B can comprise a VCO-based ADC. In some embodiments the MEMS device 602 and ASIC 604 can be housed in a single package. In other embodiments, MEMS device 602 and ASIC 604 can be housed in separate packages. One or more of the packages can comprise a sound port in the package to enable pressure variations at a membrane of the MEMS device inside the package.

Some digital microphones, as well as other products, may comprise three or more ADCs and three or more corresponding digital low-pass filters (or other types of positive group delay filters) for improving the SNR or other performance criteria. These products could benefit from the inclusion of a digital predictor filter for reducing the overall group delay. According to an embodiment, an architecture including three or more ADCs having a reduced overall group delay is described below with respect to FIG. 7.

FIG. 7 is a block diagram of a circuit 700 for use in a digital microphone or other product having three or more ADCs and a predictor filter 722 (or other type of negative group delay filter), according to an embodiment. Circuit 700 comprises a first analog-to-digital converter (ADC1) 708, a second analog-to-digital converter (ADC2) 710, and an "Nth" analog-to-digital converter (ADCN) 712, wherein "N" is an integer greater or equal to three. In an embodiment input 702 of ADC1, input 704 of ADC2, and input 706 of ADCN can be shorted together to form a single input coupled to a MEMS device (not shown in FIG. 7). In other embodiments input 702, input 704, and input 706 can comprise separate inputs. Circuit 700 also comprises a first digital low-pass filter 714 coupled to ADC1, a second digital low-pass filter 716 coupled to ADC2, and an "Nth" digital low-pass filter 718 coupled to ADCN. A digital processing circuit 720 is coupled to the first digital low-pass filter 714, the second digital low-pass filter, and the "Nth" digital low-pass filter 718. The digital processing circuit 720 can include any of the switching or combination functions described above with respect to combination circuit 614. A predictor filter 722 is coupled to the digital processing circuit 720, wherein the digital low-pass filters each comprise a positive group delay filter, and wherein the predictor filter 722 comprises a negative group delay filter, such that the overall group delay of circuit 700 is reduced relative to an embodiment without the predictor filter 722.

In summary, an embodiment architecture for a digital microphone or other product having one or more ADCs combines one or more low-pass filters having a positive group delay and a predictor filter having a negative group delay in a specific topography to achieve efficient decompression with a reduced overall group delay. In other embodiments the predictor filter can enable increased product performance (such as an increased SNR) while maintaining the same overall group delay.

Example embodiments of the present invention are summarized here. Other embodiments can also be understood from the entirety of the specification and the claims filed herein.

Example 1. A digital microphone comprises a log amplifier having an input for receiving an analog signal; an analog-to-digital converter (ADC) coupled to the log amplifier; a positive group delay filter coupled to the ADC; a digital decompression component coupled to the positive group delay filter; and a negative group delay filter coupled to the digital decompression component, the negative group delay filter having an output for generating a digital signal.

Example 2. The digital microphone according to Example 1, wherein the positive group delay filter comprises a digital low-pass filter and wherein the negative group delay filter comprises a predictor filter.

Example 3. The digital microphone according to any of the above examples, wherein the predictor filter comprises a first-order filter.

Example 4. The digital microphone according to any of the above examples, wherein the first-order filter comprises an inverse Z-transform component having an input coupled to a first input of a summer, and an output coupled to a second input of the summer.

Example 5. The digital microphone according to any of the above examples, further comprising a first gain component coupled between an input of the first-order filter and the first input of the summer; and a second gain component coupled between an output of the inverse Z-transform component and the second input of the summer.

Example 6. The digital microphone according to any of the above examples, wherein the predictor filter comprises a second-order filter.

Example 7. The digital microphone according to any of the above examples, wherein the second-order filter comprises first and second inverse Z-transform components, wherein an input of the first inverse Z-transform component is coupled to a first input of a summer, wherein a junction of the first and second inverse Z-transform components are coupled to a second input of the summer, and wherein an output of the second inverse Z-transform component is coupled to a third input of the summer.

Example 8. The digital microphone according to any of the above examples, further comprising a first gain component coupled between an input of the second-order filter and the first input of the summer; a second gain component coupled between the junction of the first and second inverse Z-transform components and the second input of the summer; and a third gain component coupled between an output of the second inverse Z-transform component and the third input of the summer.

Example 9. The digital microphone according to any of the above examples, further comprising a microelectromechanical system (MEMS) device for generating the analog signal.

Example 10. The digital microphone according to any of the above examples, further comprising an application-specific integrated circuit (ASIC) comprising the ADC, the positive group delay filter, the digital decompression component, and the negative group delay filter.

Example 11. The digital microphone according to any of the above examples, wherein the ASIC further comprises a one-bit digital modulator.

Example 12. The digital microphone according to any of the above examples, wherein the ASIC further comprises a clock input for receiving a clock signal.

Example 13. A microphone comprises a first analog-to-digital converter (ADC) having an input for receiving an analog signal; a second ADC having an input for receiving the analog signal; a first positive group delay filter coupled to the first ADC; a second positive group delay filter coupled to the second ADC; a combination circuit coupled to the first positive group delay filter and to the second positive group delay filter; a controller coupled between inputs of the first ADC and the second ADC, and a control input of the combination circuit; and a negative group delay filter coupled to the combination circuit for generating a digital signal.

Example 14. The microphone according to Example 13, wherein the first and second positive group delay filters each comprise a digital low-pass filter and the negative group delay filter comprises a predictor filter.

Example 15. The microphone according to any of the above examples, wherein the predictor filter comprises a first-order filter or a second-order filter.

Example 16. The microphone according to any of the above examples, further comprising a microelectromechanical system (MEMS) device for generating the analog signal.

Example 17. The microphone according to any of the above examples, further comprising a one-bit digital modulator coupled to the negative group delay filter.

Example 18. The microphone according to any of the above examples, wherein the combination circuit comprises a switch.

Example 19. A circuit comprising a first analog-to-digital converter (ADC); a first positive group delay filter coupled to the first ADC; a digital processing circuit coupled to the first positive group delay filter; and a negative group delay filter coupled to the digital processing circuit.

Example 20. The circuit of Example 19, further comprising at least one additional ADC; and at least one additional digital low-pass filter coupled between each of the at least one additional ADC(s) and the digital processing circuit.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A digital microphone comprising:
   a log amplifier having an input for receiving an analog signal;
   an analog-to-digital converter (ADC) coupled to the log amplifier;
   a positive group delay filter coupled to the ADC;
   a digital decompression component coupled to the positive group delay filter; and
   a negative group delay filter coupled to the digital decompression component, the negative group delay filter having an output for generating a digital signal.

2. The digital microphone according to claim 1, wherein the positive group delay filter comprises a digital low-pass filter and wherein the negative group delay filter comprises a predictor filter.

3. The digital microphone according to claim 2, wherein the predictor filter comprises a first-order filter.

4. The digital microphone according to claim 3, wherein the first-order filter comprises an inverse Z-transform component having an input coupled to a first input of a summer, and an output coupled to a second input of the summer.

5. The digital microphone according to claim 4, further comprising:
   a first gain component coupled between an input of the first-order filter and the first input of the summer; and
   a second gain component coupled between an output of the inverse Z-transform component and the second input of the summer.

6. The digital microphone according to claim 2, wherein the predictor filter comprises a second-order filter.

7. The digital microphone according to claim 6, wherein the second-order filter comprises first and second inverse Z-transform components, wherein an input of the first inverse Z-transform component is coupled to a first input of a summer, wherein a junction of the first and second inverse Z-transform components is coupled to a second input of the summer, and wherein an output of the second inverse Z-transform component is coupled to a third input of the summer.

8. The digital microphone according to claim 7, further comprising:
   a first gain component coupled between an input of the second-order filter and the first input of the summer;
   a second gain component coupled between the junction of the first and second inverse Z-transform components and the second input of the summer; and
   a third gain component coupled between an output of the second inverse Z-transform component and the third input of the summer.

9. The digital microphone according to claim 1, further comprising a microelectromechanical system (MEMS) device for generating the analog signal.

10. The digital microphone according to claim 1, further comprising an application-specific integrated circuit (ASIC) comprising the ADC, the positive group delay filter, the digital decompression component, and the negative group delay filter.

11. The digital microphone according to claim 10, wherein the ASIC further comprises a one-bit digital modulator.

12. The digital microphone according to claim 10, wherein the ASIC further comprises a clock input for receiving a clock signal.

13. A method of operating a digital microphone comprising a log amplifier having an input for receiving an analog signal, an analog-to-digital converter (ADC) coupled to the log amplifier, a positive group delay filter coupled to the ADC, a digital decompression component coupled to the positive group delay filter, and a negative group delay filter coupled to the digital decompression component, the negative group delay filter having an output for generating an output digital signal, the method comprising:
    receiving the analog signal at the input of the log amplifier;
    converting the analog signal to a digital signal using the ADC;
    filtering the digital signal using the positive group delay filter;
    decompressing the filtered digital signal using the digital decompression component; and
    filtering the decompressed digital signal using the negative group delay filter to generate the output digital signal.

14. The method according to claim 13, wherein:
    filtering the digital signal using the positive group delay filter comprises low-pass filtering the digital signal using a digital low-pass filter; and
    filtering the decompressed digital signal using the negative group delay filter comprises predicting the decompressed digital signal using a predictor filter.

15. The method according to claim 14, wherein filtering the decompressed digital signal using the predictor filter comprises using a first-order filter.

16. The method according to claim 15, further comprising:
    inverse Z-transforming the decompressed digital signal to provide an inverse Z-transformed signal using an inverse Z-transform component having an input coupled to a first input of a summer, and an output coupled to a second input of the summer.

17. The method according to claim 16, further comprising:
    applying a first gain to the decompressed digital signal using a first gain component coupled between an input of the first-order filter and the first input of the summer; and
    applying a second gain to the inverse Z-transformed signal using a second gain component coupled between an output of the inverse Z-transform component and the second input of the summer.

18. The method according to claim 14, wherein predicting the decompressed digital signal comprises using a second-order filter as the predictor filter.

19. The method according to claim 18, further comprising:
    inverse Z-transforming the decompressed digital signal using first and second inverse Z-transform components, wherein an input of the first inverse Z-transform component is coupled to a first input of a summer, wherein a junction of the first and second inverse Z-transform components is coupled to a second input of the summer, and wherein an output of the second inverse Z-transform component is coupled to a third input of the summer.

20. The method according to claim 13, further comprising generating the analog signal using a microelectromechanical system (MEMS) device.

* * * * *